US012727084B2

(12) United States Patent
Tang et al.

(10) Patent No.: US 12,727,084 B2
(45) Date of Patent: Sep. 1, 2026

(54) ANTENNA-ON-PACKAGE SYSTEM

(71) Applicant: TEXAS INSTRUMENTS INCORPORATED, Dallas, TX (US)

(72) Inventors: Yiqi Tang, Allen, TX (US); Rajen Manicon Murugan, Dallas, TX (US); Juan Herbsommer, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 525 days.

(21) Appl. No.: 17/741,560

(22) Filed: May 11, 2022

(65) Prior Publication Data

US 2023/0131441 A1 Apr. 27, 2023

Related U.S. Application Data

(60) Provisional application No. 63/271,587, filed on Oct. 25, 2021.

(51) Int. Cl.
*H05K 1/11* (2006.01)
*H01P 5/107* (2006.01)
(Continued)

(52) U.S. Cl.
CPC .............. *H05K 1/115* (2013.01); *H01P 5/107* (2013.01); *H05K 1/0243* (2013.01); *H05K 3/4038* (2013.01); *H05K 3/4644* (2013.01)

(58) Field of Classification Search
CPC ............. H01L 23/66; H01L 2223/6677; H01L 2223/6627; H01L 23/552; H01L 2223/6616; H01L 23/5222; H01L 23/5386; H01L 2924/00014; H01L 2924/00; H01L 2924/3025; H01L 2224/48091; H01L 23/49822; H01L 2924/14; H01L 2924/3011; H01L 23/3121; H01L 23/5223; H01L 23/5227; H01L 24/24; H01L 25/18; H01L 27/016; H01L 2924/0002; H01L 25/16; H01L 2223/6633; H01L 2223/6688; H01L 2224/05599; H01L 2224/45099; H01L 2224/48227; H01L 2224/85399; H01L 23/64; H01L 24/20; H01L 24/48; H01L 2924/01078; H01L 2924/01079; H01L 2924/01322; H01L 2924/09701;
(Continued)

(56) References Cited

U.S. PATENT DOCUMENTS

| | | | | |
|---|---|---|---|---|
| 2019/0207286 | A1* | 7/2019 | Moallem | H01P 5/107 |
| 2020/0343636 | A1* | 10/2020 | Nikolayenkov | H01Q 5/335 |
| 2020/0388583 | A1* | 12/2020 | Theuss | H10W 44/20 |

* cited by examiner

*Primary Examiner* — Andrea Lindgren Baltzell
*Assistant Examiner* — Tyler J Pereny
(74) *Attorney, Agent, or Firm* — Ronald O. Neerings; Frank D. Cimino

(57) ABSTRACT

One example includes an antenna-on-package (AoP) system. The system includes a first transmission line patterned on a first metal layer. The first metal layer can be arranged to be coupled on a printed circuit board (PCB). The system also includes an antenna portion patterned on a second metal layer. The first and second metal layers can be separated by at least one dielectric layer. The system further includes a coaxial transition portion comprising a via configured to communicatively couple the first transmission line on the first metal layer to a second transmission line on the second metal layer. The second transmission line can be coupled to the antenna portion.

18 Claims, 13 Drawing Sheets

(51) Int. Cl.
*H05K 1/02* (2006.01)
*H05K 3/40* (2006.01)
*H05K 3/46* (2006.01)

(58) Field of Classification Search
CPC ... H01L 2924/12042; H01L 2924/1423; H01L 2924/15153; H01L 2924/1517; H01L 2924/16152; H01L 2924/1616; H01L 2924/16195; H01L 2924/1903; H01L 2924/19041; H01L 2924/19105; H05K 1/115; H05K 1/0243; H05K 2201/09618; H05K 1/0222; H05K 1/0298; H05K 1/116; H05K 1/0237; H05K 1/181; H05K 2201/09772; H05K 2201/09845; H05K 2201/1003; H05K 1/0239; H05K 1/142; H05K 2201/09145; H05K 2201/09154; H05K 2201/09163; H05K 2201/09809; H05K 2201/10098; H05K 3/4038; H05K 1/0221; H05K 1/0306; H05K 2201/09509; H05K 2201/09781; H05K 3/429; H05K 3/4629; H01Q 23/00; H01Q 1/2283; H01Q 9/045; H01Q 21/0093; H01Q 9/0407; H01Q 1/38; H01Q 13/02; H01Q 13/18; H01Q 1/3233; H01Q 13/085; H01P 5/028; H01P 1/047; H01P 3/08; H01P 3/121; H01P 5/107; H01P 5/184; H01P 5/187; H01P 1/20345; H01P 3/16; H01P 5/18; H01P 3/082; H01P 5/103; H01P 5/12
See application file for complete search history.

800
802
804
208
206
218
220
232
234
602
239
X
Y
Z
-Z 900
904
210
208
206
X
Y
Z
906
-Z
220
218
232
234
236
238
244
602
239
240

1100
1102
212
210
208
206
X
Y
Z
220
218
232
236
234
238
602
244
242
239
240
1104
-Z

ANTENNA-ON-PACKAGE SYSTEM

RELATED APPLICATION

This application claims priority to U.S. provisional patent application No. 63/271,587, filed on Oct. 25, 2021, which is incorporated herein by reference in its entirety.

TECHNICAL FIELD

This description relates generally to communication systems, and more particularly to an antenna-on-package system.

BACKGROUND

Antennas provide a means of propagating wireless communications signals from transmitters and to receivers. As communications bandwidth increases, the size of antennas is increasingly being reduced to accommodate smaller wavelengths in a more compact form-factor. One manner of manufacturing antennas is to fabricate an antenna on an integrated circuit (IC), such as to form an antenna-on-package (AoP). Such antennas can be fabricated in a very small form-factor in a simplistic manner. However, such AoP systems require means for propagating RF signals between the antenna and associated front-end electronics.

SUMMARY

One example includes an antenna-on-package (AoP) system. The system includes a first transmission line patterned on a first metal layer. The first metal layer can be arranged to be coupled on a printed circuit board (PCB). The system also includes an antenna portion patterned on a second metal layer. The first and second metal layers can be separated by at least one dielectric layer. The system further includes a coaxial transition portion comprising a via configured to communicatively couple the first transmission line on the first metal layer to a second transmission line on the second metal layer. The second transmission line can be coupled to the antenna portion.

Another example described herein includes a method for fabricating an AoP system. The method includes forming a first metal layer on a carrier surface. The first metal layer includes a first transmission line. The method also includes forming a first via that extends from an end of the first transmission line and forming a first dielectric layer over the first metal layer. The first dielectric layer can surround the first via. The method also includes forming a second metal layer over the first dielectric layer. The second metal layer can include a second transmission line that is communicatively coupled to the first via at a first end of the second transmission line. The method also includes forming a second via that extends from a second end of the second transmission line opposite the first end and forming a second dielectric layer over the second metal layer. The second dielectric layer can surround the second via. The method further includes forming a third metal layer comprising an antenna portion and a third transmission line that extends between the antenna portion and the second via, and removing the AoP system from the carrier surface.

Another example described herein includes a communication system. The system includes a PCB that includes a drilled-via waveguide. The system also includes an AoP system. The AoP system includes a first transmission line configured to propagate a radio frequency signal on a first metal layer. The first metal layer can be arranged to be coupled to the PCB such that the drilled-via waveguide is communicatively coupled to the first transmission line. The AoP system also includes an antenna portion patterned on a second metal layer. The first and second metal layers can be separated by at least one dielectric layer. The AoP system further includes a coaxial transition portion comprising a via configured to communicatively couple the first transmission line on the first metal layer to a second transmission line on the second metal layer. The second transmission line can be coupled to the antenna portion.

DETAILED DESCRIPTION

This description relates generally to communication systems, and more particularly to an antenna-on-package (AoP) system. The AoP system can be implemented in any of a variety of communication systems. As an example, the AoP system can be mounted on a printed circuit board (PCB) that includes a waveguide to facilitate communication of radio frequency (RF) signals from the waveguide to the AoP system or from the AoP system to the waveguide. As an example, the PCB can include a drilled-via waveguide that can be communicatively coupled to the AoP system.

The AoP system includes a transmission line patterned on a first metal layer. The transmission line can be arranged as a microstrip transmission line that is communicatively coupled to the waveguide (e.g., drilled-via waveguide) of the PCB. The AoP system also includes an antenna portion patterned on a second metal layer. The antenna portion includes an antenna that can be arranged as any of a variety of different types of patterned antenna (e.g., bowtie, horn, patch, etc.), and can be coupled to a second transmission line on the second metal layer. The first and second metal layers can be separated by at least one dielectric layer. For example, the AoP system can include a third metal layer arranged between the first and second metal layers, such that the third metal layer is separated from the first metal layer by a first dielectric layer and from the second metal layer by a second dielectric layer.

As described herein, the term “metal layer” refers to a planar layer in which metal can be patterned to form to form a transmission line, a metal portion (e.g., grounded), an antenna, or a part of a via. The patterned metal that forms the “metal layer”, as described herein, is not necessarily contiguous, such that separate parts of the metal layer maybe electrically isolated from other parts of the metal layer.

The AoP system further includes at least one coaxial transition portion configured to propagate RF signals between the first transmission line and the antenna. The coaxial transition portion(s) each include a via that extends through the respective dielectric layer(s) to route the RF signal between the first and second metal layers. As described in greater detail herein, the metal layers can include metal portions that are offset from and partially surround the vias, such as to provide a coaxial transition from microstrip transmission line to a grounded coplanar waveguide (GCPW). Accordingly, the AoP system can be fabricated in a simplistic manner, such as via a multi-level package substrate (MLPS) fabrication process.

Figure 1:
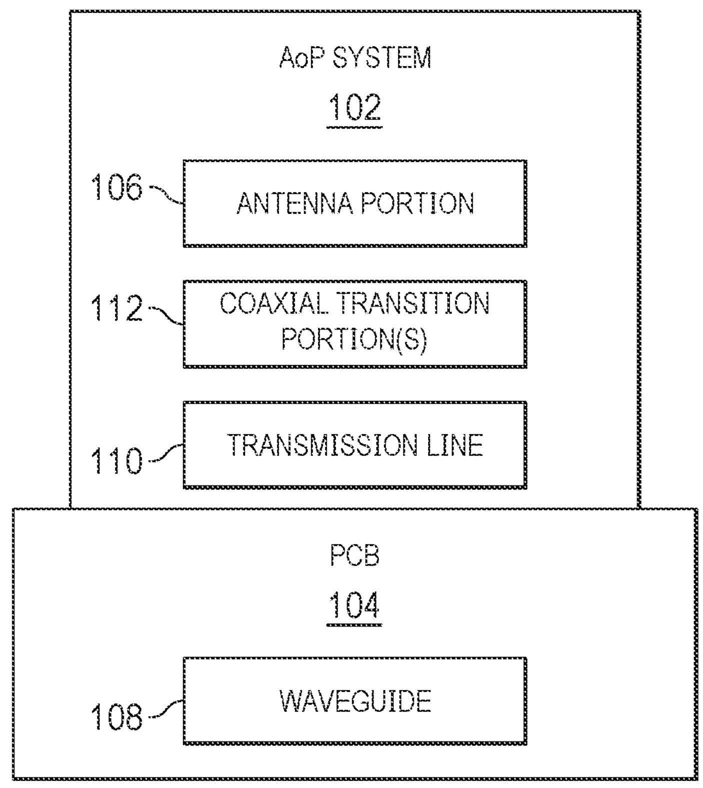
FIG. 1 is an example of a communication system.

FIG. 1 is an example of a communication system 100. The communication system 100 can be implemented to transmit and receive radio frequency (RF) signals. The communication system 100 includes a AoP system 102 that is mounted on a printed circuit board (PCB) 104. As an example, the AoP system 102 can be soldered or fastened to the PCB 104 in any of a variety of ways. The AoP system 102 includes an antenna portion 106, and the PCB 104 includes a waveguide 108 (e.g., a drilled-via waveguide). The communication system 100 can therefore facilitate propagation of radio frequency (RF) signals between an antenna of the antenna portion 106 and the waveguide 108.

The AoP system 102 includes a transmission line 110 that can be patterned on a first metal layer of the AoP system 102. The transmission line 110 can be arranged as a microstrip transmission line that is communicatively coupled to the waveguide 108 of the PCB 104. The antenna portion 106 can be patterned on a second metal layer of the AoP system 102. The antenna of the antenna portion 106 can be arranged as any of a variety of different types of patterned antenna (e.g., bowtie, horn, patch, etc.), and the antenna portion 106 can include a second transmission line that is patterned on the second metal layer and is communicatively coupled to the antenna. The first and second metal layers can be separated by at least one dielectric layer. For example, the AoP system 102 can include a third metal layer arranged between the first and second metal layers, such that the third metal layer is separated from the first metal layer by a first dielectric layer and from the second metal layer by a second dielectric layer.

The AoP system 102 further includes at least one coaxial transition portion 112 configured to propagate RF signals between the transmission line 110 and the antenna of the antenna portion 106. The coaxial transition portion(s) 112 each include a via that extends through the respective dielectric layer(s) to route the RF signal between the first and second metal layers of the AoP system 102. As described in greater detail herein, the metal layers can include metal portions that are offset from and partially surround the vias, such as to provide a coaxial transition from microstrip transmission line to a grounded coplanar waveguide (GCPW). Accordingly, the AoP system 102 can be fabricated in a simplistic manner, such as via a multi-level package substrate (MLPS) fabrication process.

Figure 2:
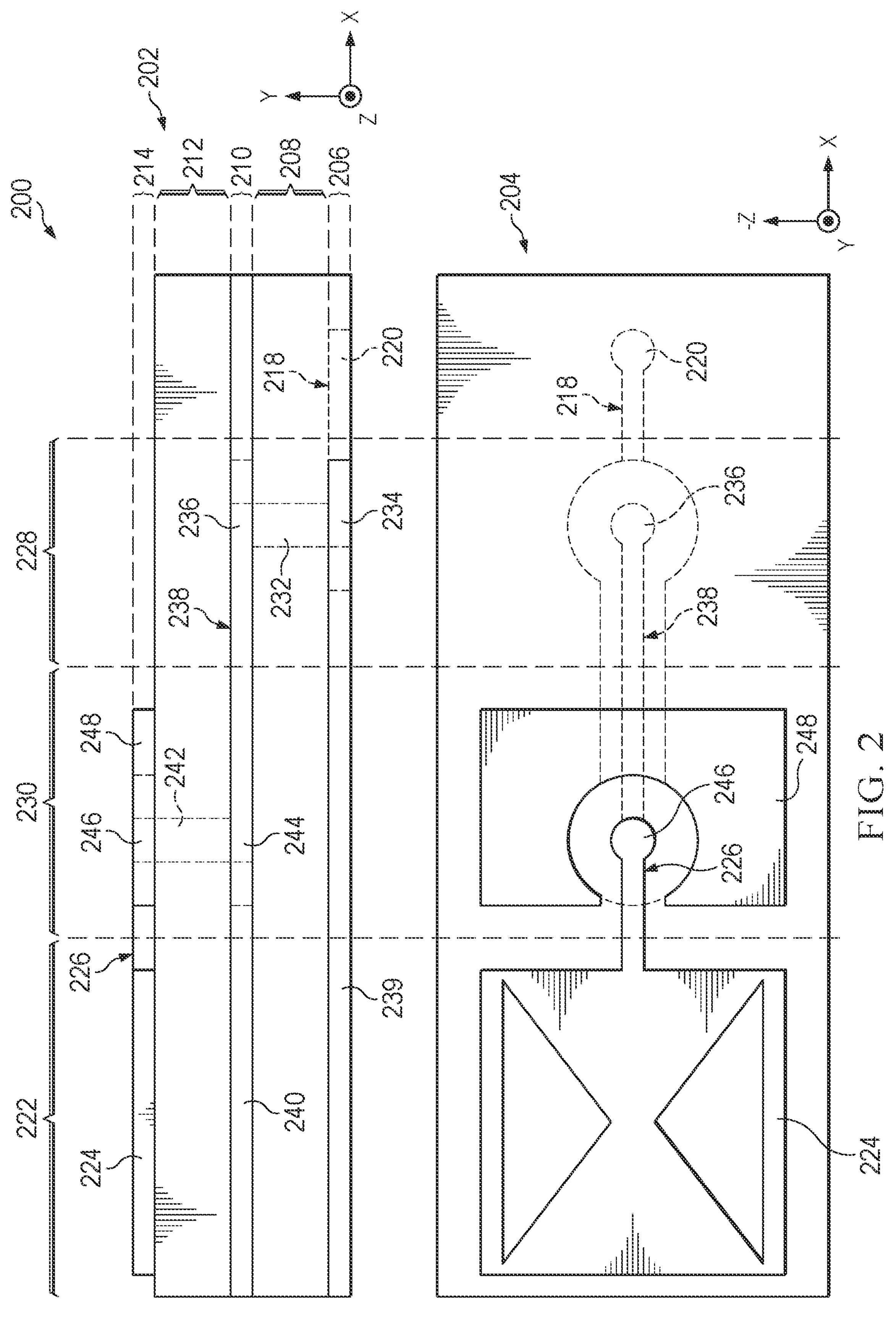
FIG. 2 is an example of an antenna-on-package (AoP) system.

FIG. 2 is an example of a AoP system 200. The AoP system 200 can correspond to the AoP system 102 in the example of FIG. 1. Therefore, reference is to be made to the example of FIG. 1 in the following description of the example of FIG. 1. In the example of FIG. 2, the AoP system 200 is demonstrated in two views that are orthogonal with respect to each other. A first view 202 demonstrates the AoP system 200 in the XY-plane and a second view 204 demonstrates the AoP system 200 in the XZ-plane.

The AoP system 200 includes a first metal layer 206, a first dielectric layer 208, a second metal layer 210, a second dielectric layer 212, and a third metal layer 214. The metal layers 206, 210, and 214 can be formed from a variety of metals (e.g., copper) that are patterned to form separate conductive or grounded portions of the AoP system 200. The dielectric layers 208 and 212 can be formed from any of a variety of dielectric materials (e.g., thermoplastics) that can separate the metal layers 206, 210, and 214, and can surround vias that extend between the metal layers 206, 210, and 214. As an example and as described in greater detail herein, the AoP system 200 can be fabricated from an MLPS fabrication process. The third metal layer 214 can correspond to the second metal layer described in the example of FIG. 1, and the second metal layer 210 can correspond to the third metal layer described in the example of FIG. 1.

The AoP system 200 also includes a first transmission line 218 that is patterned on the first metal layer 206. The first transmission line 218 includes a first end 220 that can be communicatively coupled to the waveguide 108 of the PCB 104 in the example of FIG. 1. The AoP system 200 includes an antenna portion 222 that is patterned on the third metal layer 214. The antenna portion 222 includes an antenna 224 and a third transmission line 226 that is communicatively coupled to the antenna 224. In the example of FIG. 2, the antenna 224 is arranged as a bowtie antenna, but other antenna types can be patterned on the third metal layer 214. The AoP system 200 further includes a first coaxial transition portion 228 and a second coaxial transition portion 230 that provide communicative coupling between the first transmission line 218 and the antenna 224.

Figure 3:
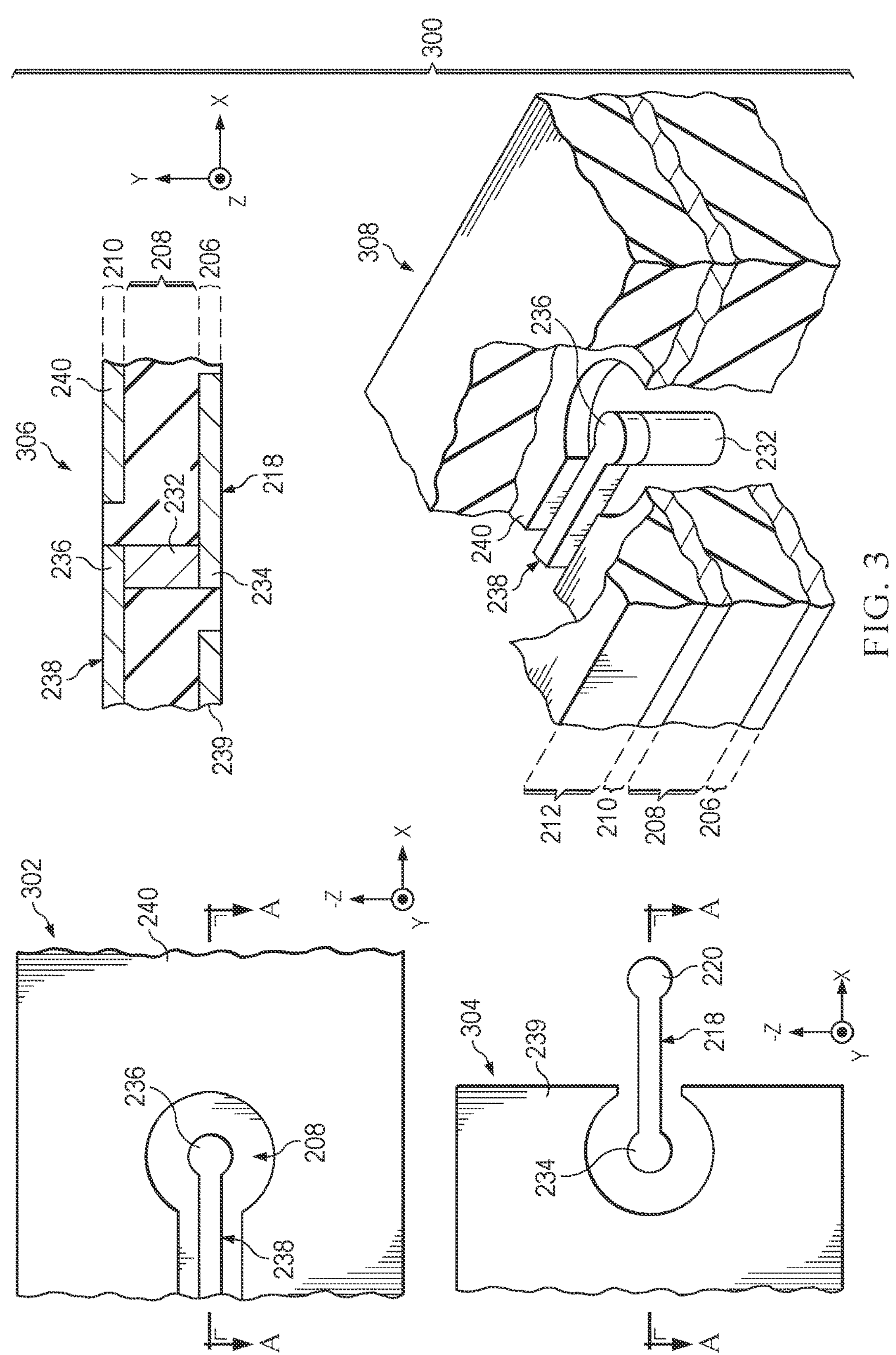
FIG. 3 is an example of a first coaxial transition portion.

The first coaxial transition portion 228 is demonstrated in the example of FIG. 2, and in greater detail in the example of FIG. 3. FIG. 3 is an example diagram 300 of the first coaxial transition portion 228. The diagram 300 includes a first view 302 that demonstrates the patterning on the second metal layer 210, a second view 304 that demonstrates the patterning on the first metal layer 206, a cross-sectional view 306 of the first coaxial transition portion 228 taking along "A", and a perspective view 308 of the first coaxial transition portion 228. The perspective view 308 includes portions of the first metal layer 206, the second metal layer 210, the first dielectric layer 208, and the second dielectric layer 212 that are cut-away to show detail.

The first coaxial transition portion 228 includes a first via 232 that is surrounded by the first dielectric layer 208 between the first and second metal layers 206 and 210. The first via 232 is conductively coupled to a second end 234 of the first transmission line 218 on the first metal layer 206 and is conductively coupled to a first end 236 of a second transmission line 238 on the second metal layer 210. As an example, the first transmission line 218 is arranged as a microstrip transmission line. In the example of FIG. 3, the first metal layer 206 includes a first metal region 239 that partially surrounds the second end 234 of the first transmission line 218. In the example of FIG. 2, the second metal layer 210 includes a second metal portion 240 that partially surrounds the end of the first via 232 that is conductively coupled to the second transmission line 238, and completely surrounds second transmission line 238. Therefore, the first coaxial transition portion 228 can provide a transition from a microstrip transmission line to a grounded coplanar waveguide (GCPW). Alternatively, the first coaxial transition portion 228 can provide a transition from a microstrip transmission line to a stripline transmission line.

In the example of FIG. 3, the perspective view 308 does not demonstrate the first transmission line 218. The first transmission line 218 can be conductively coupled to the first via 232, similar to as described above. However, as an alternative example, the first transmission line 218 can be obviated from the AoP system 200. In this example, the waveguide 108 can be communicatively coupled directly to the first via 232, instead of coupled to the first transmission line 218.

Figure 4:
FIG. 4 is an example of a second coaxial transition portion.

The second coaxial transition portion 230 is demonstrated in the example of FIG. 2, and in greater detail in the example of FIG. 4. FIG. 4 is an example diagram 400 of the second coaxial transition portion 230. The diagram 400 includes a first view 402 that demonstrates the patterning on the third metal layer 214, a second view 404 that demonstrates the patterning on the second metal layer 210, a cross-sectional view 406 of the second coaxial transition portion 230 taking along "A", and a perspective view 408 of the second coaxial transition portion 230. The perspective view 408 includes portions of the second metal layer 210, the third metal layer 214, the first dielectric layer 208, and the second dielectric layer 212 that are cut-away to show detail.

The second coaxial transition portion 230 includes a second via 242 that is surrounded by the second dielectric layer 212 between the second and third metal layers 206 and 210. The second via 242 is conductively coupled to a second end 244 of the second transmission line 238 on the second metal layer 210 and is conductively coupled to a first end 246 of the third transmission line 226 on the third metal layer 214. In the example of FIG. 2, the third metal layer 214 includes a third metal portion 248 that partially surrounds the third transmission line 226 and the end of the second via 242 that is conductively coupled to the third transmission line 226. Therefore, the second coaxial transition portion 230 can provide a transition from GCPW to GCPW, or from stripline transmission line to GCPW. The third transmission line 226 is conductively coupled to the antenna 224 in the antenna portion 222. Accordingly, as demonstrated in the examples of FIGS. 2-4, the first and second coaxial transition portions 228 and 230 propagate RF signals between the antenna 224 and the first transmission line 218.

Figure 5:
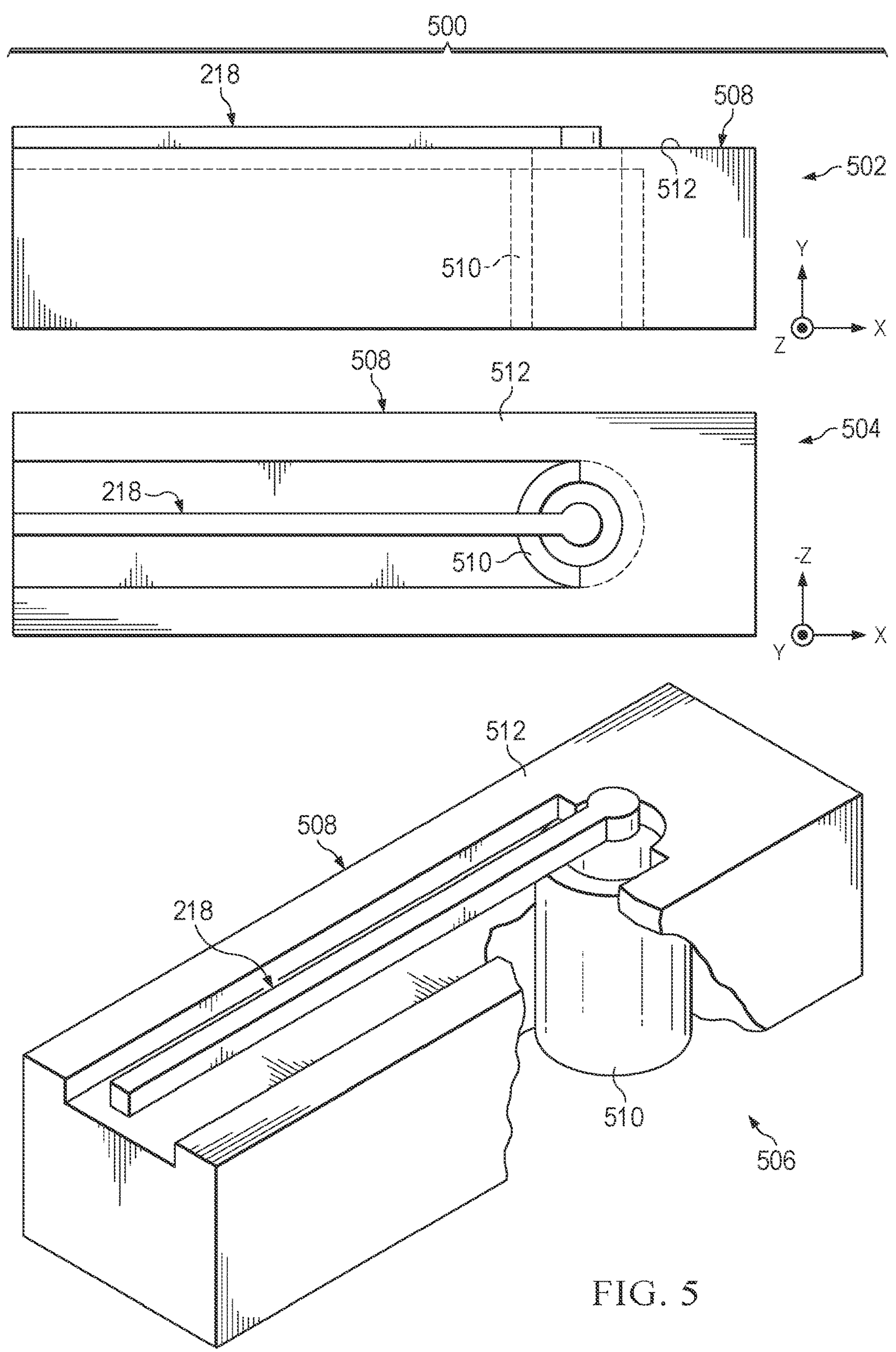
FIG. 5 is an example of a printed circuit board waveguide.

As described above, the first transmission line 218 can be arranged proximal to the waveguide 108 in the PCB 104 in the example of FIG. 1. The example of FIG. 5 demonstrates an example of the communicative coupling of the waveguide 108 with the first transmission line 218. FIG. 5 is an example diagram 500 of a PCB waveguide. The diagram 500 includes two views that are orthogonal with respect to each other. A first view 502 demonstrates the PCB waveguide in the XY-plane and a second view 504 demonstrates the PCB waveguide in the XZ-plane. The diagram 500 also demonstrates a perspective view 506 of the PCB waveguide.

The diagram 500 demonstrates a PCB 508, a waveguide 510, and the first transmission line 218. The perspective view 506 includes portions of the PCB 508 that are cut-away to show detail. The PCB 508 includes a top surface 512 to which the AoP system 200 is coupled (e.g., based on solder mounts). In the example of FIG. 5, a portion of the top surface 512 is removed to expose an opening of the waveguide 510. Additionally, in the example of FIG. 5, the waveguide 510 is demonstrated as a drilled-via waveguide, and is therefore a hollow metal tube that propagates the RF signal. Therefore, the RF signal can propagate along the Y-axis from the waveguide 510 to the first transmission line 218 or from the first transmission line 218 to the waveguide 510.

The first and second views 502 and 504 and the perspective view 506 in the example of FIG. 5 demonstrate that the waveguide 510 is communicatively coupled to the first transmission line 218. However, as an alternative example, the waveguide 510 can be communicatively coupled directly to the first via 232. Therefore, as described above in the example of FIG. 3, the first transmission line 218 can be obviated from the communication system 100, such that the RF signal can propagate between the first via 232 and the waveguide 510 without an interposing first transmission line 218.

The examples of FIGS. 6-12 demonstrate an example of fabrication of the AoP system 200. As described herein, the examples of FIGS. 6-12 are described based on an MLPS fabrication process. However, other fabrication processes can be implemented for fabricating the AoP system 200.

Figure 6:
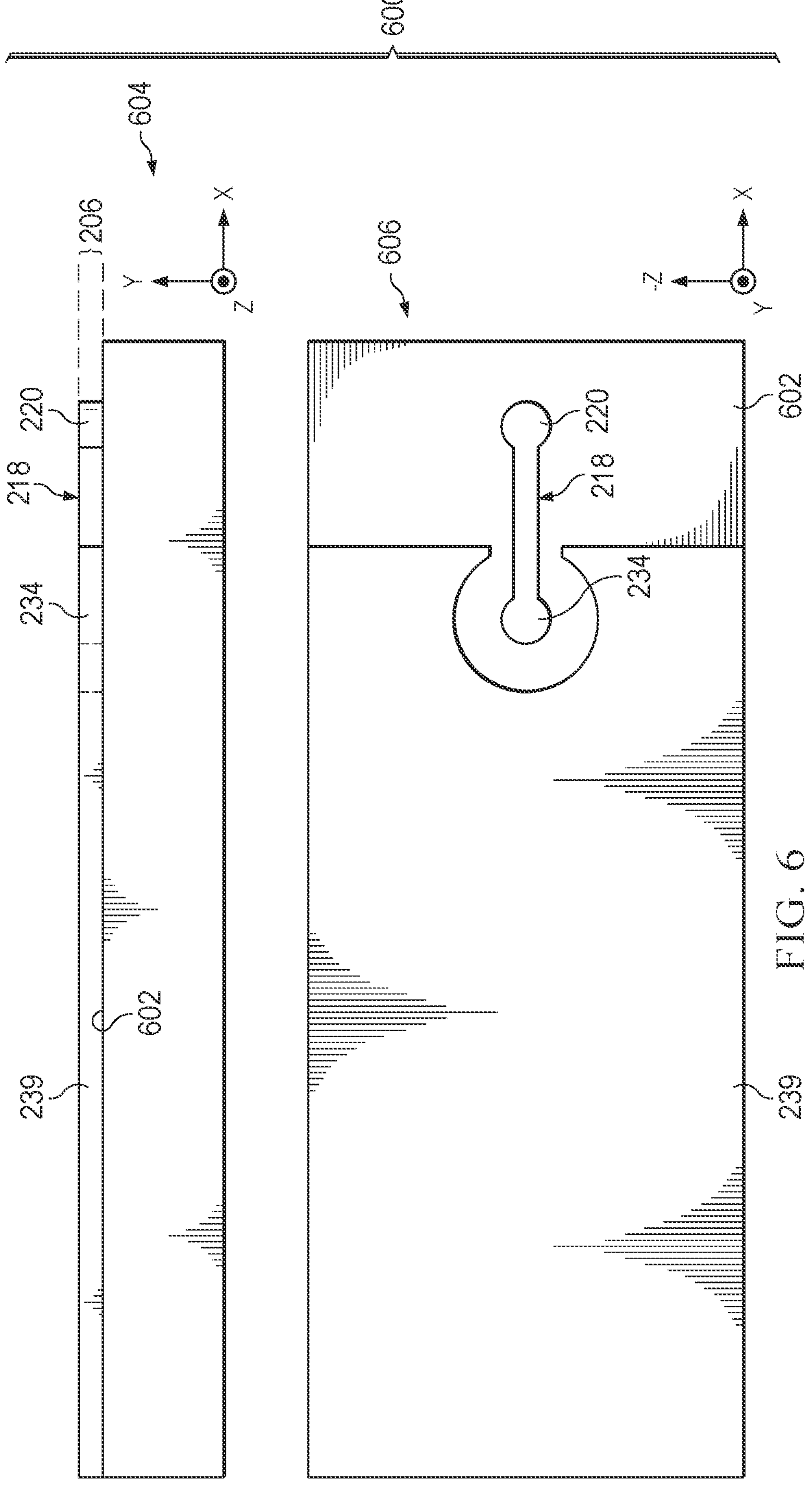
FIG. 6 is a first fabrication step of an the AoP system.

FIG. 6 is an example of a first fabrication step 600 in forming the AoP system 200. The first fabrication step 600 demonstrates forming the first metal layer 206 on a carrier surface 602 in a first view 604 and a second view 606. For example, the first metal layer 206 can be any of a variety of conductive metals (e.g., copper). As an example, the carrier surface 602 can correspond to a metal surface on which AoP system 200 is formed, after which the AoP system 200 is removed from the carrier surface 602, as described in greater detail herein. In the example of FIG. 6, the first metal layer 206 includes the first transmission line 218 and a first metal portion 239. The first metal portion 239 can correspond to a ground plane of the AoP system 200 (e.g., based on a solder connection to the PCB 104). In the example of FIG. 6, the first metal portion 239 partially surrounds the second end 234 of the first transmission line 218. As an example, the first metal portion 239 could be obviated, or could be arranged to not surround (e.g., partially or otherwise) the first transmission line 218, such as in the example of the first transmission line 218 being arranged as a microstrip transmission line.

Figure 7:
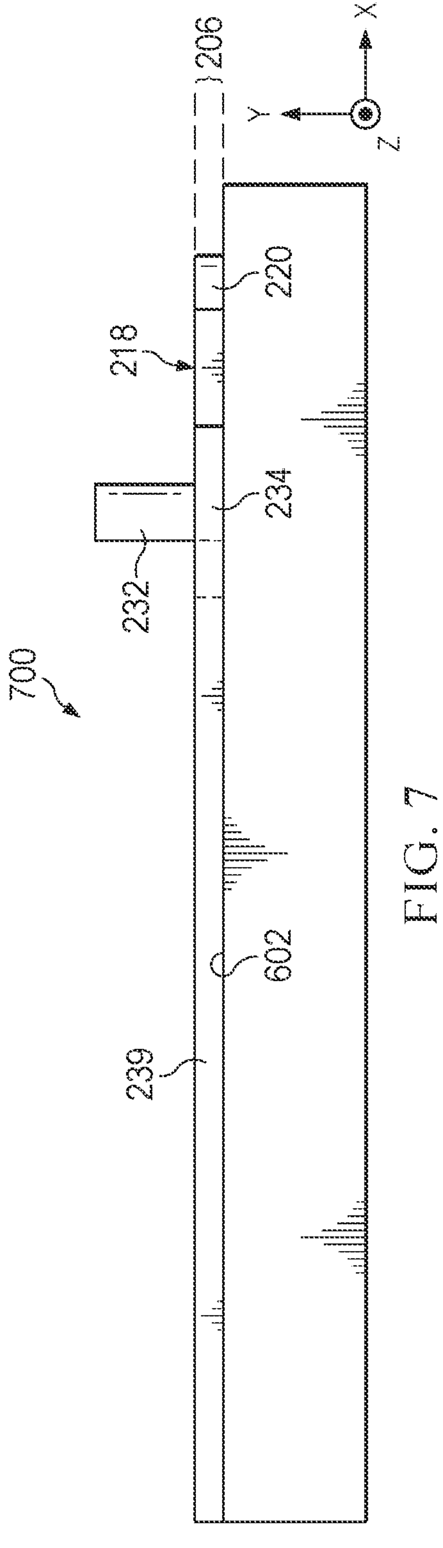
FIG. 7 is a second fabrication step of an the AoP system.

FIG. 7 is an example of a second fabrication step 700 in forming the AoP system 200. The second fabrication step 700 demonstrates forming the first via 232 over the second end 234 of the first transmission line 218. For example, the first via 232 can be any of a variety of conductive metals (e.g., copper).

Figure 8:
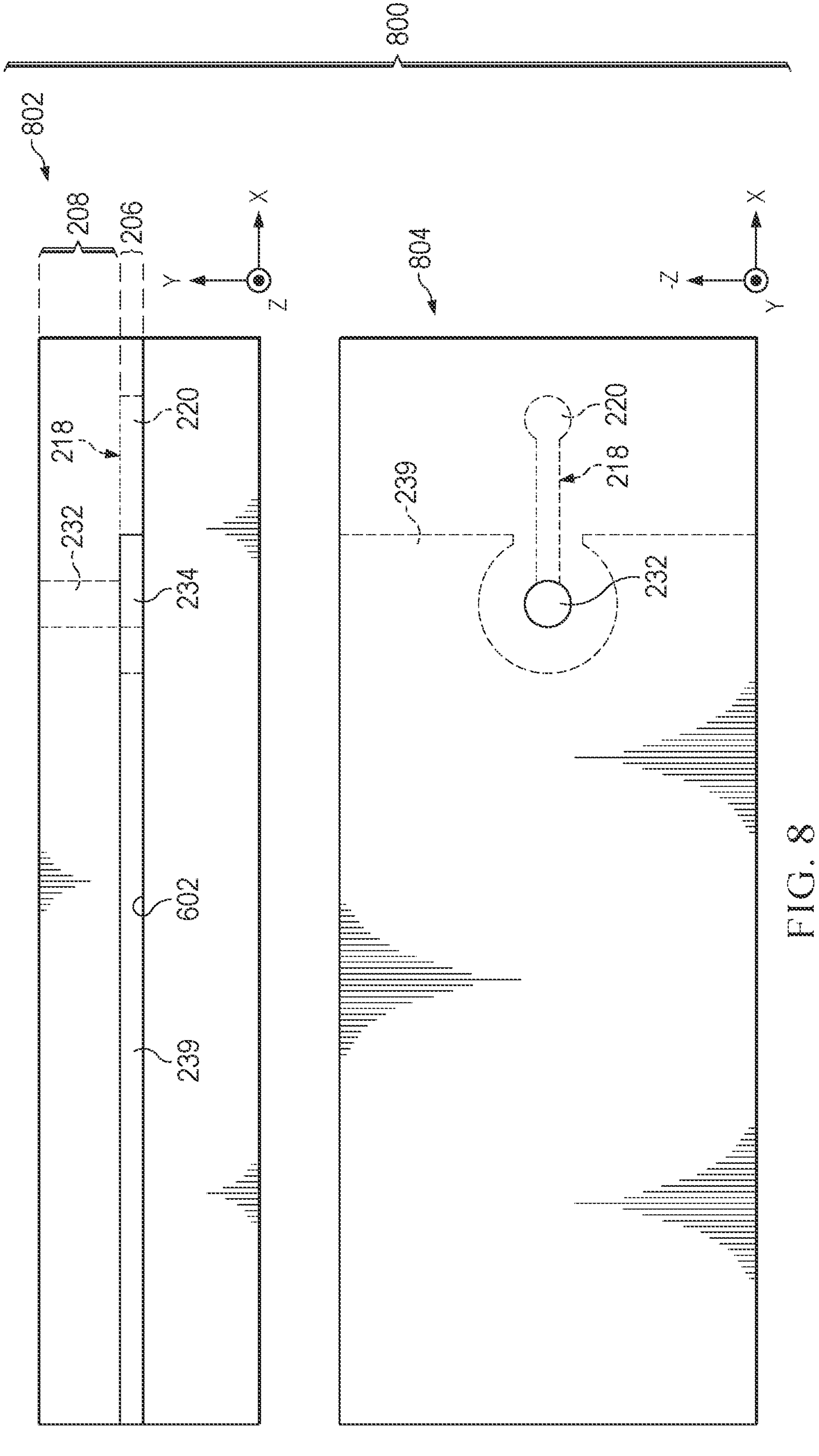
FIG. 8 is a third fabrication step of an the AoP system.

FIG. 8 is an example of a third fabrication step 800 in forming the AoP system 200. The third fabrication step 800 demonstrates a first view 802 and a second view 804 of depositing a dielectric material over the carrier surface 602. The dielectric material is deposited over the first metal layer 206 and over the first via 232 to form the first dielectric layer 208. Therefore, the first dielectric layer 208 surrounds the first via 232. As an example, the dielectric material that forms the first dielectric layer 208 can be a thermoplastic material that is compression molded over the first metal layer 206. As an additional step, the dielectric material that forms the first dielectric layer 208 and the first via 232 can be grinded down to a desired thickness, such that the end of the first via 232 is exposed.

Figure 9:
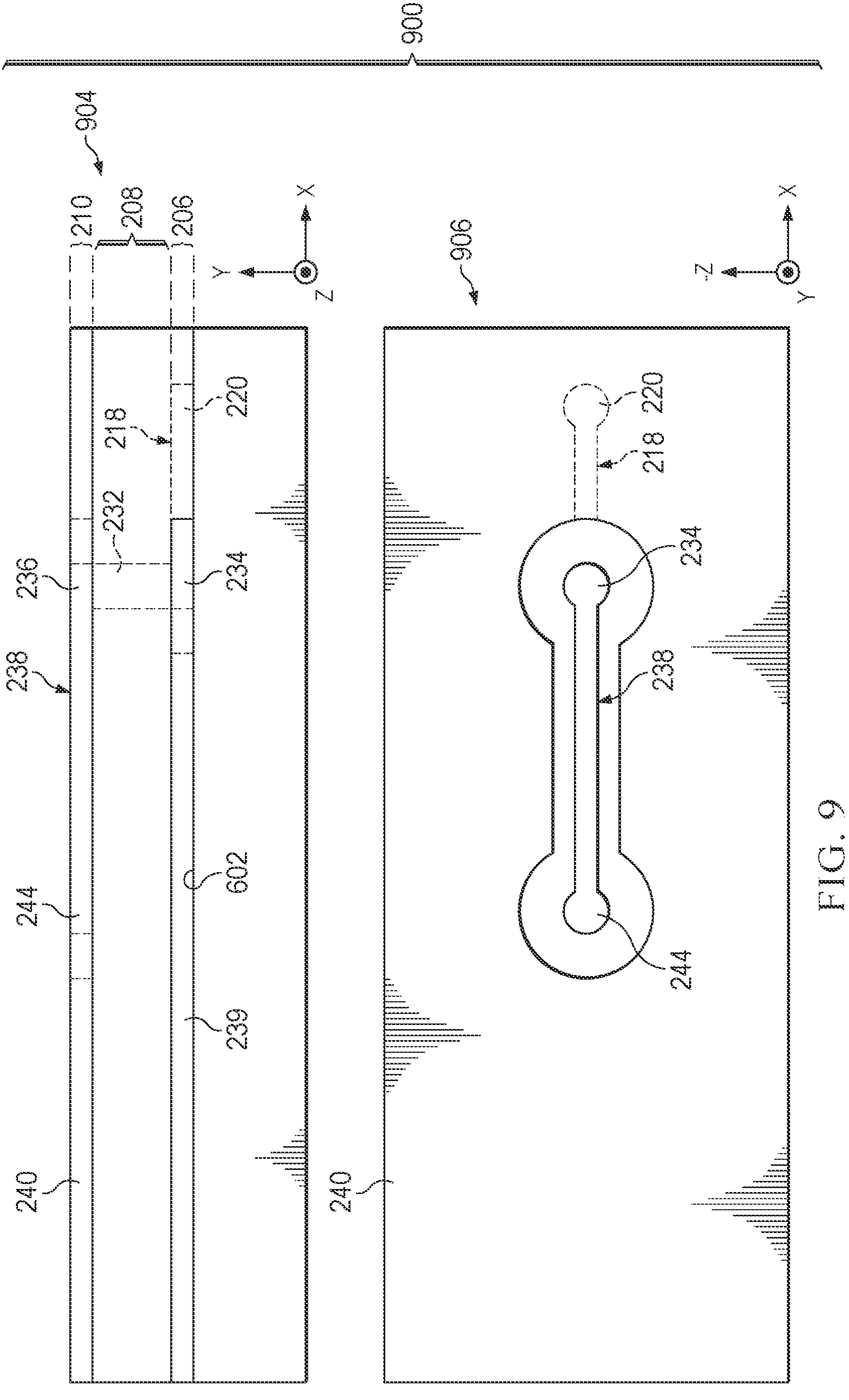
FIG. 9 is a fourth fabrication step of an the AoP system.

FIG. 9 is an example of a fourth fabrication step 900 in forming the AoP system 200. The fourth fabrication step 900 demonstrates forming the second metal layer 210 on the first dielectric layer 208 in a first view 904 and a second view 906. For example, the second metal layer 210 can be any of a variety of conductive metals (e.g., copper). In the example of FIG. 9, the second metal layer 210 includes the second transmission line 238 and the second metal portion 240. The first end 236 of the second transmission line 238 is formed over the first via 232, such that the first via 232 is conductively coupled (e.g., formed integral with) the second transmission line 238. The second metal portion 240 can be conductively coupled (e.g., through vias (not shown)) to the first metal portion 239, and can thus be grounded. In the example of FIG. 9, the second metal portion 240 completely surrounds the second transmission line 238.

Figure 10:
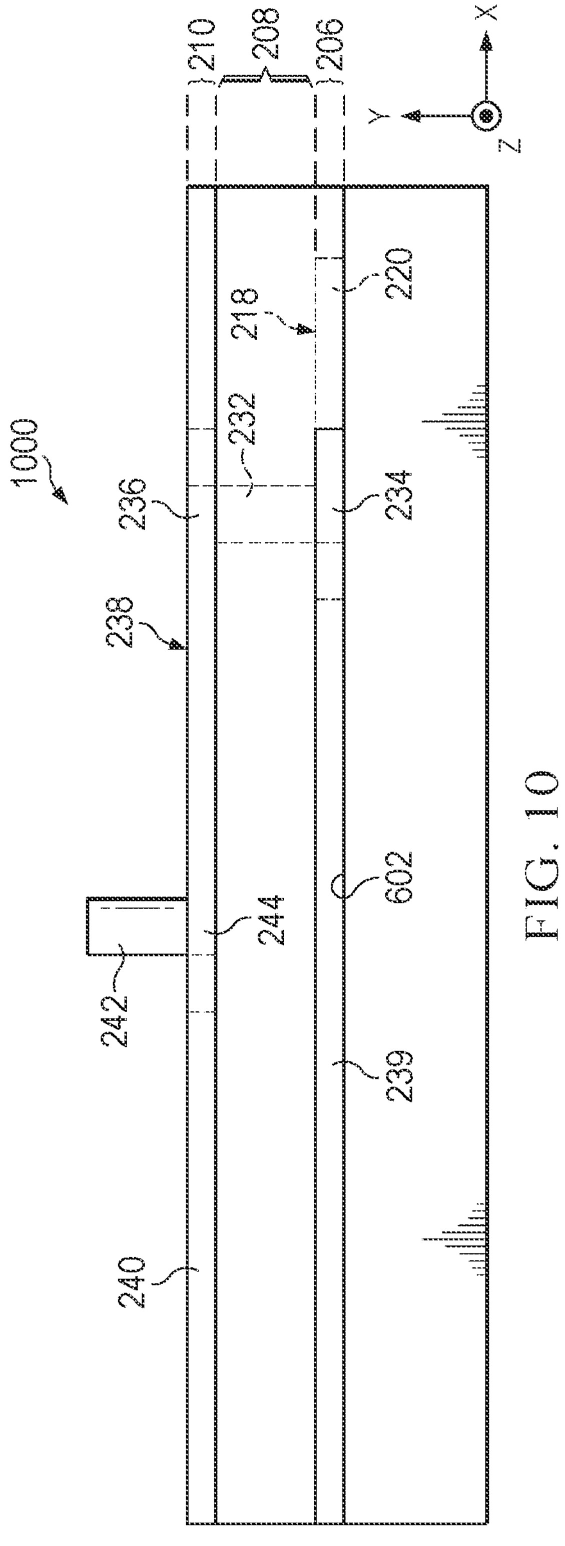
FIG. 10 is a fifth fabrication step of an the AoP system.

FIG. 10 is an example of a fifth fabrication step 1000 in forming the AoP system 200. The fifth fabrication step 1000 demonstrates forming the second via 242 over the second end 244 of the second transmission line 238. For example, the second via 242 can be any of a variety of conductive metals (e.g., copper).

Figure 11:
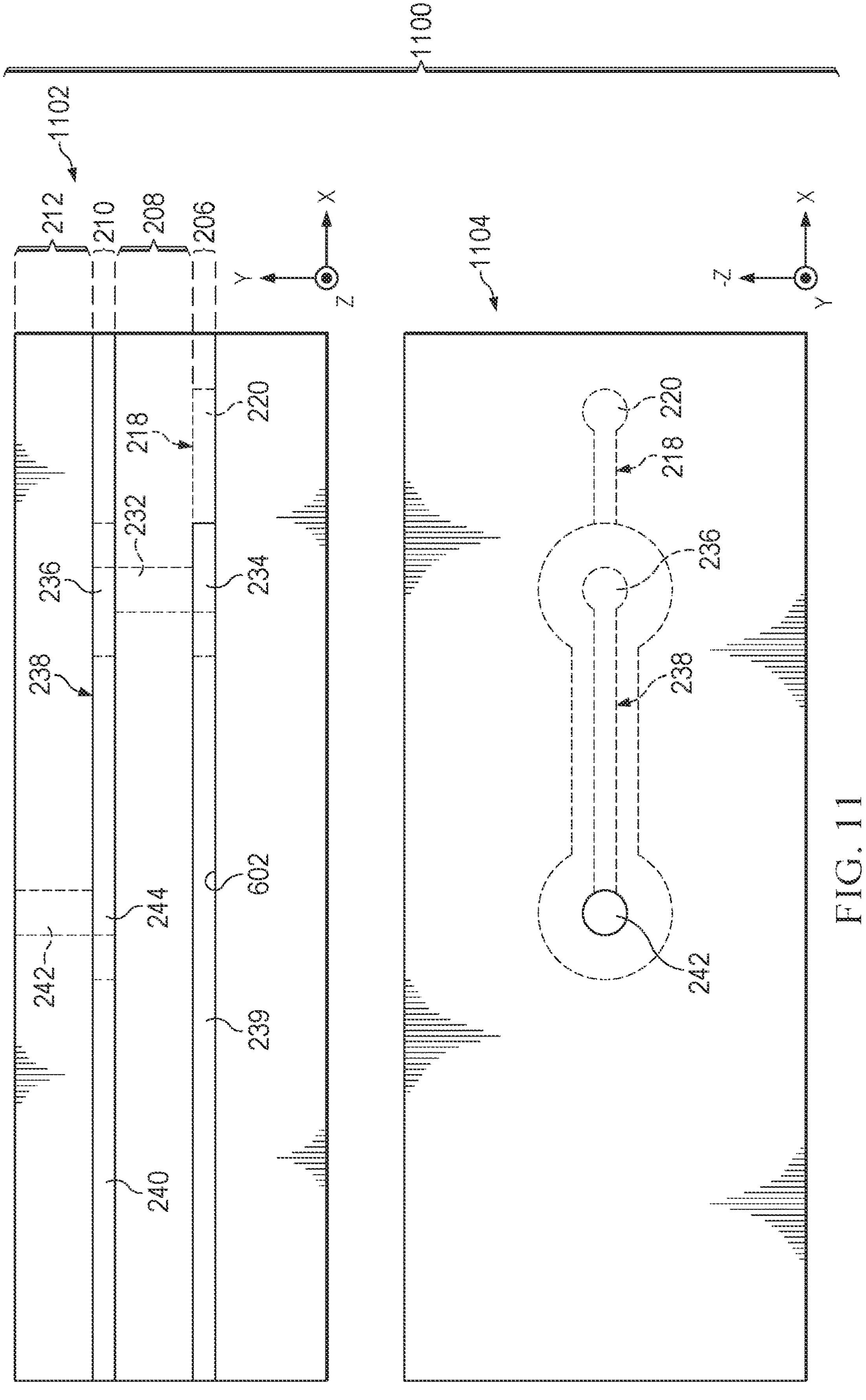
FIG. 11 is a sixth fabrication step of an the AoP system.

FIG. 11 is an example of a sixth fabrication step 1100 in forming the AoP system 200. The sixth fabrication step 1100 demonstrates a first view 1102 and a second view 1104 of depositing a dielectric material over the carrier surface 602. The dielectric material is deposited over the second metal layer 210 and over the second via 242 to form the second dielectric layer 212. Therefore, the second dielectric layer 212 surrounds the second via 242. As an example, the dielectric material that forms the second dielectric layer 212 can be a thermoplastic material that is compression molded over the second metal layer 210. As an additional step, the dielectric material that forms the second dielectric layer 212 and the second via 242 can be grinded down to a desired thickness, such that the end of the second via 242 is exposed.

Figure 12:
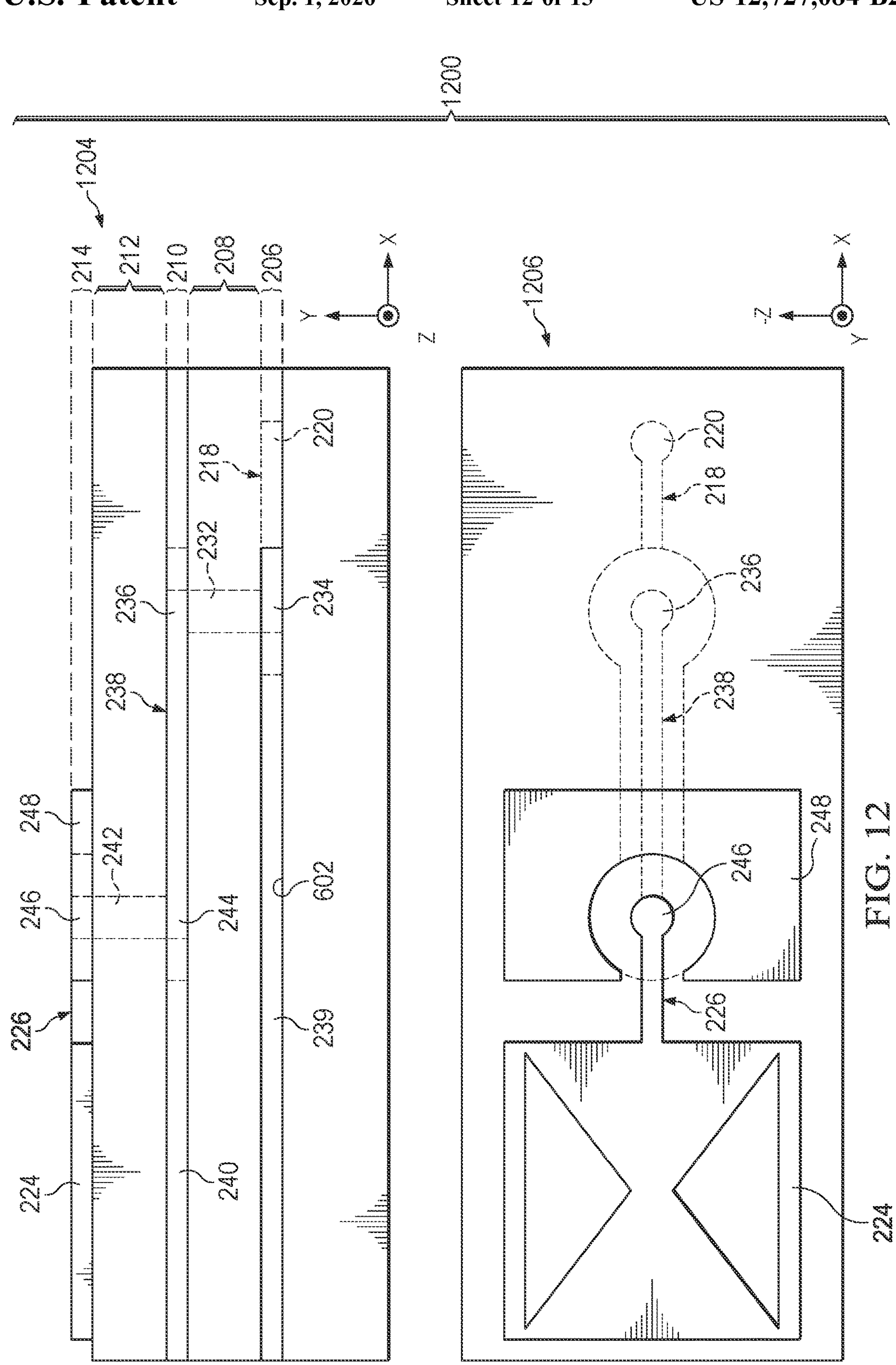
FIG. 12 is a seventh fabrication step of an the AoP system.

FIG. 12 is an example of a seventh fabrication step 1200 in forming the AoP system 200. The seventh fabrication step 1200 demonstrates forming the third metal layer 214 on the second dielectric layer 212 in a first view 1204 and a second view 1206. For example, the third metal layer 214 can be any of a variety of conductive metals (e.g., copper). In the example of FIG. 12, the third metal layer 214 includes the antenna 224, the third transmission line 226, and the third metal portion 248. The first end 246 of the third transmission line 226 is formed over the second via 242, such that the second via 242 is conductively coupled (e.g., formed integral with) the third transmission line 226. The third metal portion 248 can be conductively coupled (e.g., through vias (not shown)) to the second metal portion 240, and can thus be grounded. In the example of FIG. 12, the second metal portion 240 partially surrounds the third transmission line 226.

Upon completion of the seventh fabrication step 1200, the finished AoP system 200 is removed from the carrier surface 602 and can be coupled (e.g., mounted, soldered, etc.) to the PCB 104 to form the communication system 100. Accordingly, the examples of FIGS. 6-12 demonstrate a method for fabricating the AoP system 200 in a simplistic manner and having a compact form-factor relative to typical AoP systems.

Figure 13:
FIG. 13 is an example of a method for fabricating an AoP system.
Figure 13:
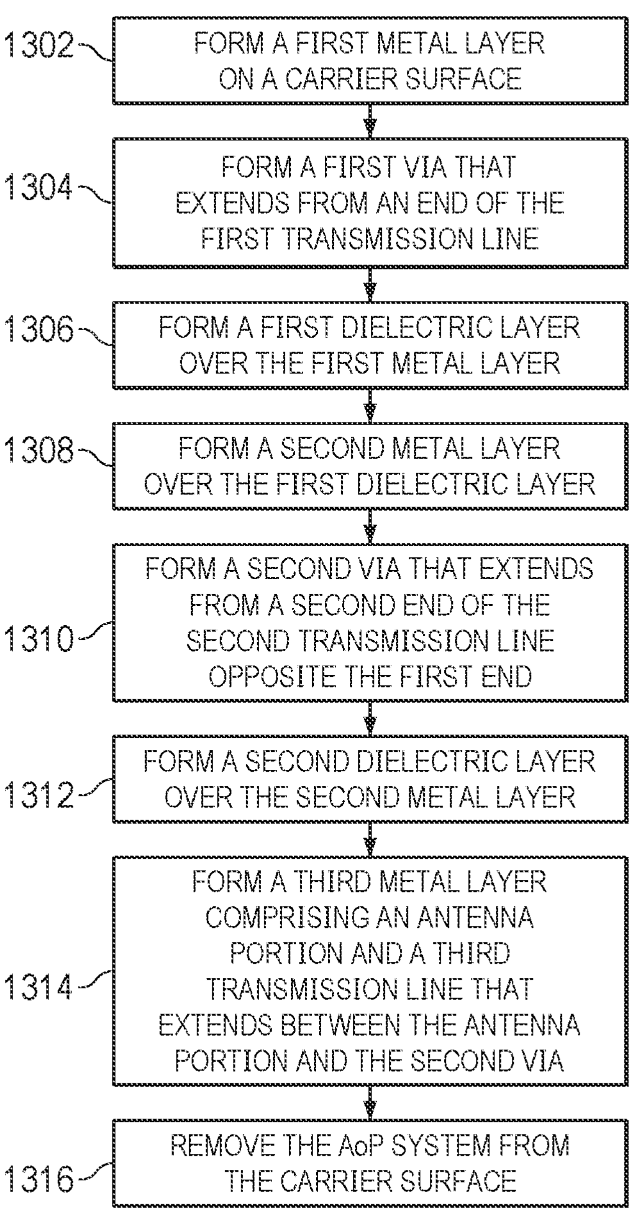

In view of the foregoing structural and functional features described above, a methodology in accordance with various aspects of the disclosure will be better appreciated with reference to FIG. 13. It is to be understood and appreciated that the method of FIG. 13 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 13 illustrates an example of a method 1300 for fabricating a AoP system (e.g., the AoP system 200). At 1302, a first metal layer (e.g., the first metal layer 206) is formed on a carrier surface (e.g., the carrier surface 602). The first metal layer can include a first transmission line (e.g., the first transmission line 218). At 1304, a first via (e.g., the first via 232) that extends from an end of the first transmission line is formed. At 1306, a first dielectric layer (e.g., the first dielectric layer 208) is formed over the first metal layer. The first dielectric layer can surround the first via. At 1308, a second metal layer (e.g., the second metal layer 210) is formed over the first dielectric layer. The second metal layer can include a second transmission line (e.g., the second transmission line 238) that is communicatively coupled to the first via at a first end of the second transmission line. At 1310, a second via (e.g., the second via 242) that extends from a second end of the second transmission line opposite the first end is formed. At 1312, a second dielectric layer (e.g., the second dielectric layer 212) is formed over the second metal layer. The second dielectric layer can surround the second via. At 1314, a third metal layer (e.g., the third metal layer 214) comprising an antenna portion (e.g., the antenna portion 222) and a third transmission line (e.g., the third transmission line 226) that extends between the antenna portion and the second via is formed. At 1316, the AoP system is removed from the carrier surface.

In this description, numerical designations “first”, “second”, etc. are not necessarily consistent with same designations in the claims herein. Additionally, the term “couple” may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is “configured to” perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term “non-transitory” may indicate that the storage medium is not embodied in a carrier wave or a propagated signal. In certain examples, a non-transitory storage medium may store data that can, over time, change (e.g., in RAM or cache).

Modifications are possible in the described embodiments, and other embodiments are possible, within the scope of the claims.

What is claimed is:

1. An antenna-on-package (AoP) system comprising:
a first transmission line patterned on a first metal layer, the first metal layer being arranged to be coupled on a printed circuit board (PCB);
an antenna portion patterned on a second metal layer, the first and second metal layers being separated by at least one dielectric layer; and
a coaxial transition portion comprising a via configured to communicatively couple the first transmission line on the first metal layer to a second transmission line on the second metal layer, the second transmission line being coupled to the antenna portion, wherein the coaxial transition portion comprises:
a first coaxial transition portion comprising a first via configured to communicatively couple the first transmission line on the first metal layer to a third transmission line on a third metal layer, the third metal layer being arranged between the first and second metal layers and being separated from the first metal layer by a first dielectric layer and being separated from the second metal layer by a second dielectric layer; and
a second coaxial transition portion comprising a second via configured to communicatively couple the third transmission line on the third metal layer to the antenna portion on the second metal layer.

2. The AoP system of claim 1, wherein the first transmission line is arranged as a microstrip transmission line and wherein the second transmission line is arranged as a grounded coplanar waveguide (GCPW).

3. The AoP system of claim 1, wherein the first transmission line is arranged as a microstrip transmission line and wherein each of the second and third transmission lines are arranged as grounded coplanar waveguides (GCPWs).

4. The AoP system of claim 1, wherein the first via comprises a first end that is conductively coupled to the first transmission line on the first metal layer, wherein the first metal layer comprises a first metal region that partially surrounds and is spaced apart from the first end of the first via.

5. The AoP system of claim 4, wherein the second via comprises a first end that is conductively coupled to the second transmission line on the second metal layer and a second end that is conductively coupled to a first end of the third transmission line on the third metal layer, wherein the second metal layer comprises a second metal region that partially surrounds and is spaced apart from the first end of the second via.

6. The AoP system of claim 5, wherein the first via comprises a second end that is conductively coupled to a second end of the third transmission line opposite the first end on the third metal layer, wherein the third metal layer comprises a third metal region that surrounds and is spaced apart from the third transmission line.

7. The AoP system of claim 1, wherein the AoP system is fabricated by a multi-level package substrate (MLPS) fabrication process.

8. A communication system comprising the AoP system of claim 1, the communication system further comprising the PCB on which the AoP is coupled, wherein the PCB comprises a waveguide communicatively coupled to the first transmission line.

9. The communication system of claim 8, wherein the waveguide is arranged as a drilled-via waveguide.

10. A method for fabricating an antenna-on-package (AoP) system, the method comprising:
forming a first metal layer on a carrier surface, the first metal layer comprising a first transmission line;
forming a first via that extends from an end of the first transmission line;
forming a first dielectric layer over the first metal layer, the first dielectric layer surrounding the first via;
forming a second metal layer over the first dielectric layer, the second metal layer comprising a second transmission line that is communicatively coupled to the first via at a first end of the second transmission line;
forming a second via that extends from a second end of the second transmission line opposite the first end;
forming a second dielectric layer over the second metal layer, the second dielectric layer surrounding the second via;
forming a third metal layer comprising an antenna portion and a third transmission line that extends between the antenna portion and the second via; and
removing the AoP system from the carrier surface.

11. The method of claim 10, wherein the first via comprises a first end that is conductively coupled to the first transmission line on the first metal layer, wherein forming the first metal layer comprises forming the first metal layer comprising a first metal region that partially surrounds and is spaced apart from the first end of the first via.

12. The method of claim 11, wherein the second via comprises a first end that is conductively coupled to the third transmission line on the third metal layer and a second end that is conductively coupled to a first end of the second transmission line on the second metal layer, wherein forming the third metal layer comprises forming the third metal layer comprising a third metal region that partially surrounds and is spaced apart from the first end of the second via.

13. The method of claim 12, wherein the first via comprises a second end that is conductively coupled to a second end of the second transmission line opposite the first end on the second metal layer, wherein forming the second metal layer comprises forming the second metal layer comprising the third metal region that surrounds and is spaced apart from the second transmission line.

14. The method of claim 10, wherein forming the first metal layer comprises forming the first metal layer to be arranged to be coupled to a printed circuit board (PCB), the PCB comprising a drilled-via waveguide that is arranged to be communicatively coupled with the first transmission line.

15. A communication system comprising:
a printed circuit board (PCB) comprising a drilled-via waveguide; and
an antenna-on-package (AoP) system, the AoP system comprising:
a first transmission line configured to propagate a radio frequency signal on a first metal layer, the first metal layer being arranged to be coupled to the PCB such that the drilled-via waveguide is communicatively coupled to the first transmission line;
an antenna portion patterned on a second metal layer, the first and second metal layers being separated by at least one dielectric layer; and
a coaxial transition portion comprising a via configured to communicatively couple the first transmission line on the first metal layer to a second transmission line on the second metal layer, the second transmission line being coupled to the antenna portion, wherein the coaxial transition portion comprises:

a first coaxial transition portion comprising a first via configured to communicatively couple the first transmission line on the first metal layer to a third transmission line on a third metal layer, the third metal layer being arranged between the first and second metal layers and being separated from the first metal layer by a first dielectric layer and being separated from the second metal layer by a second dielectric layer; and a second coaxial transition portion comprising a second via configured to communicatively couple the third transmission line on the third metal layer to the antenna portion on the second metal layer.

16. The communication system of claim 15, wherein the first via comprises a first end that is conductively coupled to the first transmission line on the first metal layer, wherein the first metal layer comprises a first metal region that partially surrounds and is spaced apart from the first end of the first via.

17. The communication system of claim 16, wherein the second via comprises a first end that is conductively coupled to the second transmission line on the second metal layer and a second end that is conductively coupled to a first end of the third transmission line on the third metal layer, wherein the second metal layer comprises a second metal region that partially surrounds and is spaced apart from the first end of the second via.

18. The communication system of claim 17, wherein the first via comprises a second end that is conductively coupled to a second end of the third transmission line opposite the first end on the third metal layer, wherein the third metal layer comprises a third metal region that surrounds and is spaced apart from the third transmission line.

* * * * *